United States Patent [19]
Smith

[11] 3,983,457
[45] Sept. 28, 1976

[54] COAX CABLE SEIZURE DEVICE
[75] Inventor: Sidney R. Smith, Buckeye, Ariz.
[73] Assignee: Hughes Aircraft Company, Culver City, Calif.
[22] Filed: Feb. 18, 1976
[21] Appl. No.: 659,182

[52] U.S. Cl. .............................. 317/99; 174/52 R; 339/94 C; 339/177 R
[51] Int. Cl.² .......................................... H05K 5/04
[58] Field of Search ................ 174/52 R, 59, 65 R, 174/65 SS, 88 C; 317/99; 339/94 C, 177 R, 177 E, 89 C, 249 R, 249 B; 333/6, 8, 9, 10

[56] References Cited
UNITED STATES PATENTS

| | | | |
|---|---|---|---|
| 3,440,329 | 4/1969 | Winston | 174/52 R |
| 3,617,811 | 11/1971 | McVoy | 317/99 |
| 3,668,612 | 6/1972 | Nepovim | 174/65 SS |
| 3,676,744 | 7/1972 | Pennypacker | 317/99 |
| 3,846,738 | 11/1974 | Nepovim | 339/177 R |
| 3,847,463 | 11/1974 | Hayward | 339/177 R X |
| 3,854,789 | 12/1974 | Kaplan | 339/177 R |
| 3,951,490 | 4/1976 | Devendorf | 174/52 X |

Primary Examiner—J. V. Truhe
Assistant Examiner—David A. Tone
Attorney, Agent, or Firm—Don O. Dennison; William H. MacAllister

[57] ABSTRACT

An improved seizure device for connecting coaxial cable transmission lines to electronic devices is disclosed. According to the invention, the center conductor of the coaxial cable is inserted in an opening between two tines of a conductive post which is electrically connected to the electronic circuitry. The outer conductor of the coaxial cable is inserted through a serrated ferrule. A single clamping nut provides a force which acts through the serrated ferrule, a guide clamp and a tapered seizure post holder to simultaneously clamp the inner and outer conductors for electrical and mechanical contact.

10 Claims, 4 Drawing Figures

COAX CABLE SEIZURE DEVICE

FIELD OF THE INVENTION

This invention relates to connecting devices and more specifically to devices for seizing connecting coaxial cable transmission lines to electronic apparatus.

DESCRIPTION OF THE PRIOR ART

A great number of connecting mechanisms have been developed over the years for use with coaxial cable type transmission lines. Of particular interest to the cable television industry are coaxial connectors which are suitable for use under extremely harsh environmental conditions. For example, in connecting amplifiers or subscriber taps to a coaxial cable transmission line, factors such as temperature, humidity, wind, ice, rain, dust, and the like are frequently encountered. The connectors must provide reliable electrical and mechanical performance under all of these conditions even though unattended for long periods of time.

Because of some of these factors, large tensile loads on the coaxial cable are encountered. These loads are borne by the connecting device at the ends of each section of cable. To absorb these tensile loads, it is advantageous or even necessary to seize or clamp both the inner and outer conductors of the coaxial cable at their point of electrical connection. Thus, coaxial cable connectors subjected to the elements are also coaxial cable seizure devices as well.

In the past, coaxial cable connectors of the seizure type have generally employed a seizure post with a transversely extending opening therethrough. The center conductor of the coaxial cable, or frequently the center conductor of a fitting connected to the cable, is passed through the opening and clamped in position by means of a screw in the seizure post. In order to tighten or loosen the seizure screw, access ports are provided in the housing of the device being connected. The access ports, of course, must be sealed from the elements by means of access port bolts or other means. The outer conductor of the coaxial cable is also seized, typically by a conductive cylindrical ferrrule which "bites" into the outer conductor when clamped or tightened.

It is a general object of the present invention to provide a coaxial cable seizure type connecting device of simplified construction.

It is another object of the present invention to provide means for seizing both conductors of a coaxial cable by means of a single tightening adjustment.

It is yet another object of the present invention to provide means for connecting a coaxial cable to electrical apparatus fitted in a weather-tight housing without requiring access ports communicating with the interior of the housing.

SUMMARY OF THE INVENTION

In keeping with the principles of the present invention, these objects are accomplished by means of a split or bifurcated conductive seizure post which is inserted in an opening in a bifurcated seizure post holder. The seizure post holder which is fabricated of a resilient dielectric material is disposed within a sealed housing which also houses the electrical apparatus being connected to the coaxial line.

The center conductor of the coaxial line is passed through the seizure post through a circular opening between its tines. A cylindrical serrated ferrule is disposed around the outer conductor of the coaxial cable. Both the ferrule and the seizure post holder are provided with tapers at their respective end regions which fit within concave depressions in an axially-aligned dielectric cylindrical guide clamp. By tightening a single crimp nut, its longitudinal motion is translated to lateral forces which clamp the ferrule to the outer conductor of the coaxial cable and the seizure post to the inner conductor of the coaxial cable simultaneously. An additional closure nut and conventional "O" ring seal provides a weather-tight seal.

BRIEF DESCRIPTION OF THE DRAWINGS

The above-mentioned and other features and objects of the present invention will become more apparent by reference to the following description taken in conjunction with the accompanying drawings wherein like reference numerals denote like elements and in which.

DESCRIPTION OF THE PREFERRED EMBODIMENT

Figure 1:
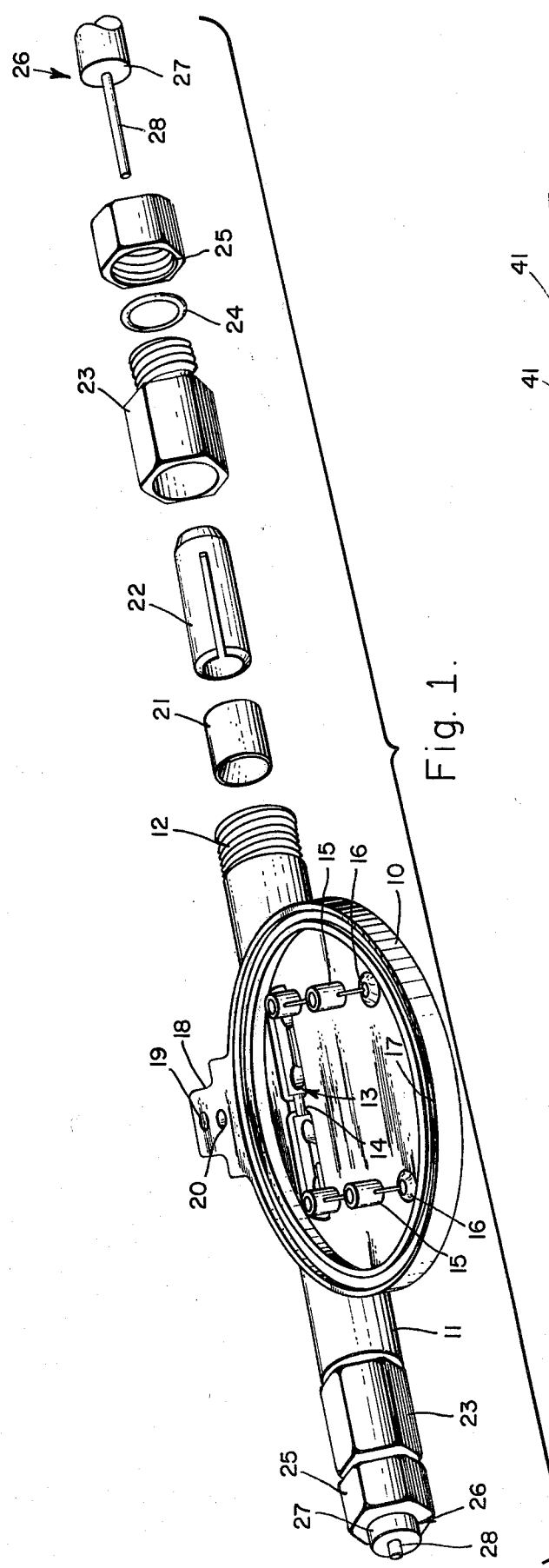
FIG. 1 is a partially exploded pictorial view of a four-way CATV subscriber tap utilizing the present invention.
Figure 2:
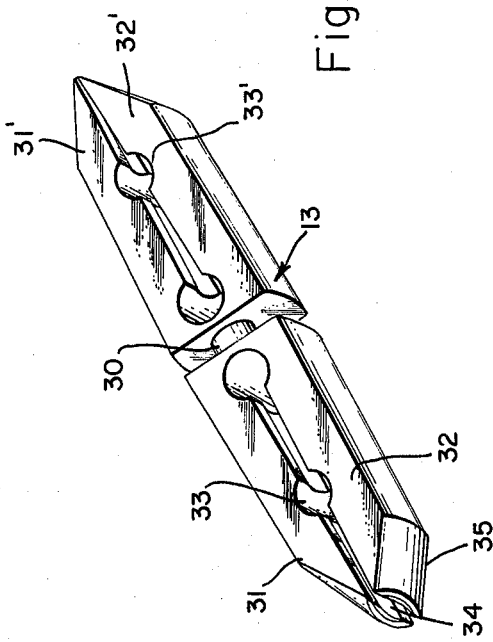
FIG. 2 is a pictorial view of a seizure post holder in accordance with the present invention.

Referring more specifically to the drawings, FIG. 1 is a partially exploded view of a four-way CATV subscriber tap utilizing the present invention. In FIG. 1 a unitary housing 10 which can be cast of a zinc alloy, for example, is provided. A pair of oppositely disposed threaded extensions 11 and 12 extend on either side of housing 10 to allow for the insertion of the sections of a coaxial cable to which the tap is coupled. A seizure post holder 13 which can be machined or molded, for example, from a resilient dielectric material is located in a recessed portion within housing 10 and axially aligned with extensions 11 and 12. Seizure post holder 13, shown in greater detail in FIG. 2, is held loosely in position by means of guides 14 in the recessed portion of housing 10.

Figure 3:
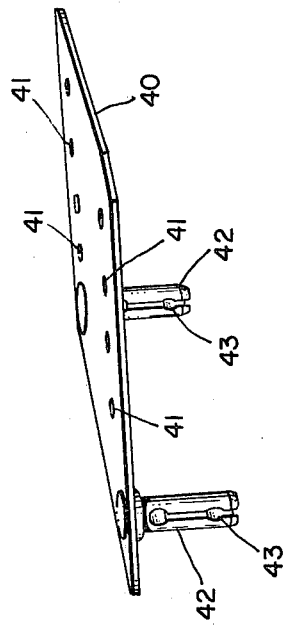
FIG. 3 is a pictorial view of a printed circuit board illustrating the details of the seizure posts.

Also forming a portion of unitary housing 10 are threaded screw posts 15 which project from the base of the housing and facilitate the mounting of the printed circuit board of FIG. 3. Coaxial terminals 16 are mounted in and extend through the base of housing 10. The center conductors of terminals 16 extend upward from the base also to facilitate connection to the printed circuit board. The threaded portions of terminals 16 extend downwardly from the base of housing 10 and are not shown in the drawing. A circular groove 17 extends around the outer periphery of housing 10 to facilitate the placement and mounting of a cover. Also integral to housing 10 is a mounting tab 18 which is provided with a guide post 19 and screw hold 20 for a mounting clamp not shown.

Shown in their exploded disassembled position on the right are a cylindrical guide clamp 21 with concave indentations on either end; a serrated ferrule 22; a crimp nut 23; and O-ring seal 24; closure nut 25 and coaxial cable 26. Coaxial cable 26 further consists of a solid outer conductor 27 and solid inner conductor 28 separated by a suitable low loss dielectric medium as is well known in the art. An identical combination of elements comprise the assembly on the right hand portion of body 10.

The operation of the present invention will be better understood after the remaining figures are considered. In this connection, FIG. 2 is a pictorial representation of the seizure post holder 13 showing the details thereof. As mentioned previously, seizure post holder 13 is preferably fabricated of Delrin or other suitable resilient dielectric material.

Seizure post holder 13 comprises two bifurcated clamping portions separated by a narrow waist 30 which when assembled is mated to guides 14. Each of the clamping portions comprise a pair of tines 31, 32 and 31', 32' through which is formed a transverse, generally circular aperture 33, 33' which accommodates the posts to be secured. A pair of second flex aperture are formed through each of the clamping portions of seizure post holder 13 to reduce the section in those regions to provide for improved flexibility. A longitudinally extending circular aperture 34 is formed between the tines to accommodate the inner conductors of coaxial cable sections 26. A bevel 35 of partial conical shape is formed at the ends of seizure post holder 13. The angle of bevel 35 is substantially the same as the internal concave indentations in guide clamps 21.

In FIG. 3 there is shown a pictorial view of a printed circuit board 40 on which is mounted the various electrical components of the subscriber tap. For the sake of clarity, the components are not shown. Apertures 41 are provided through the printed circuit board 40 to accommodate the mounting screws also not shown. Another set of apertures are provided in the printed circuit board to accommodate the center conductors of coaxial terminals 16. A pair of seizure posts 42 extend downwardly from printed circuit board 40. These seizure posts, which can be fabricated of brass or other suitable resilient conductive material are also bifurcated or split to form a pair of tines. Apertures 43 of generally circular shape ar provided in posts 42 between the tines to accommodate inner conductors 28 of coaxial cables 26.

The diameters of posts 42 are substantially the same as the diameters of apertures 33 of seizure post holder 13. Due to the resiliancy of the seizure posts 42 and the seizure post holder 13 and their construction, it is apparent that the dimensional tolerances here need not be precise. Seizure posts 42 serve in a multiple capacity. First, the posts serve as the electrically conductive medium for coupling radio frequency wave energy to and from inner conductor 28 of coaxial cable 26 to the components on the circuit board. Secondly, the seizure posts can serve to couple low frequency or direct current energy to and from the coaxial cable such as for powering purposes. The posts also serve the primary mechanical means for retaining the inner conductor 28 of coaxial cable 27 although, as will be seen, some of the clamping action is provided by seizure post holder 13.

In its assembled state, the printed circuit board 40 with its components mounted thereon is mated with housing 10 so that seizure posts 42 extend into apertures 33 in seizure post holder 13. The board is further secured by screws, not shown, extending through apertures 41 into screw posts 15. The center conductors of the coaxial terminals 16 are soldered to the printed circuit in the region of their respective apertures. Seizure posts 42 are also connected to the components of the subscriber tap by means of the printed circuitry on printed circuit board 40.

Figure 4:
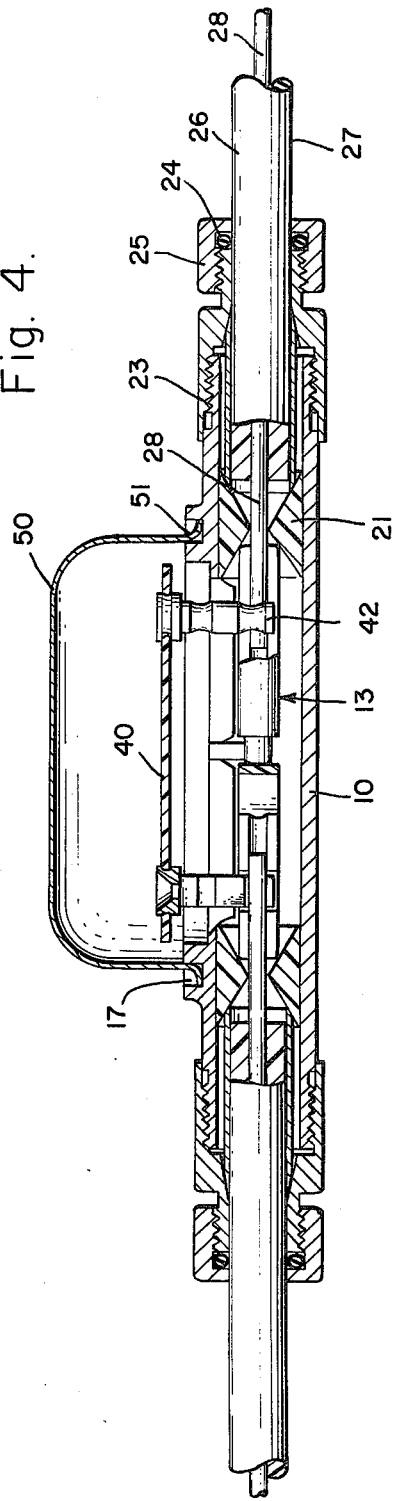
FIG. 4 is a planned view in broken-away cross section of the assembled subscriber tap.

A plan view in broken-away cross section of the assembled subscriber tap is shown in FIG. 4. After the printed circuit board 40 is mounted on body 10, a weathertight substantially dome-shaped cover 50 is positioned on the body 10. Cover 50 is provided with a flange 51 which fits within circular groove 17. Generally, a gasket or other suitable seal can be provided within groove 17 to further improve the weather-tight cover seating. When pressed into groove 17, the flange 51 on cover 50 seats itself in the manner of a "Belleville spring" and is thus clamped in position.

In assembling the subscriber tap of FIG. 4, the outer conductors 27 and dielectric material of coaxial cables 26 are trimmed back so that the inner conductors 28 extend through the central apertures of guide clamps 21, aperture 34 of seizure post holder 13 and apertures 43 in posts 42. When crimp nut 23 is tightened, its axial motion forces the bevelled ends of serrated ferrule 22 to clamp and securely hold the outer conductor 27 of coaxial cable 26. The tightening of the crimp nut also forces the tines of seizure post holder 13 together thereby clamping the inner conductor 28 of coaxial cable 26 in place. The O-ring 24 and closure nut 25 provide a weather-tight seal for the completed assembly.

Electrical continuity to the outer conductor 27 of coaxial cable 26 is provided through serrated ferrule 22, which is of conductive material, and the extensions 11 or 12 on housing 10. As previously mentioned, electrical continuity between the inner conductor 28 and the printed circuitry is provided through seizure posts 42.

In all cases it is understood that the above-described embodiment is merely illustrative of but one of the many possible specific embodiments which can represent applications of the principles of the present invention. Numerous and varied other arrangements can be readily devised in accordance with these principles by those skilled in the art without departing from the spirit and scope of the invention.

What is claimed is:
1. A connecting device for coaxial cable transmission lines comprising, in combination:
  a conductive housing having a recessed portion extending substantially transversely therethrough;
  said housing having at least one threaded cylindrical extension with an opening communicating with said recessed portion;
  a dielectric seizure post holder having a pair of tines and at least one aperture extending transversely therebetween;
  a seizure post having a pair of tines and at least one aperture extending transversely therebetween, said seizure post being disposed within the aperture of said seizure post holder;
  a cylindrical serrated ferrule axially aligned with said seizure post holder and disposed at least partially within the opening formed in said extension;
  a cylindrical dielectric guide clamp axially disposed within said opening between said ferrule and said seizure post holder; and
  clamping means engaging said threaded extension and mechanically cooperating with both said ferrule and said seizure post holder for providing a lateral clamping force to said ferrule and the tines of said seizure post.

2. The connecting device according to claim 1 wherein said guide clamp is provided with concave depressions at opposite ends thereof and said serrated ferrule and the tines of said seizure post holder are provided with bevels at the ends thereof which mate with said guide clamp.

3. The connecting device according to claim 1 wherein said clamping means comprises a crimp nut for applying axial force to said serrated ferrule.

4. The connecting device according to claim 1 further comprising printed circuit board means mechanically and electrically connected to said seizure post and said body.

5. The connecting device according to claim 4 further comprising connector means extending through said body and electrically coupled to said printed circuit board means.

6. A connecting device for coaxial cable transmission lines comprising, in combination:
   a conductive housing having a recessed portion extending substantially transversely therethrough;
   said housing having a pair of threaded cylindrical extensions with openings communicating with said recessed portion;
   a dielectric seizure post holder having a pair of tines at either end thereof, at least one aperture extending through said seizure post holder between each of said pair of tines;
   a pair of seizure posts, each having a pair of tines and at least one aperture extending therebetween, each of said seizure posts being disposed within an aperture of said seizure post holder;
   a pair of cylindrical serrated ferrules, each of said ferrules being axially aligned with said seizure post holder and disposed at least partially within the opening of one of said extensions;
   a pair of cylindrical dielectric guide clamps axially disposed at opposite ends of said seizure post holder, each of said guide clamps being disposed within one of said openings between one of said ferrules and said seizure post holder; and
   a pair of clamping means engaging each of said threaded extensions and mechanically cooperating with said ferrules and said seizure post holder for providing lateral clamping forces to said ferrule and the tines of said seizure posts.

7. The connecting device according to claim 6 wherein said guide clamps are provided with concave depressions at opposite ends thereof and said serrated ferrules and the tines of said seizure post holder are bevelled at the ends thereof which mate with said guide clamps.

8. The connecting device according to claim 6 wherein said clamping means comprises a pair of crimp nuts each of which is adapted to apply an axial force to the serrated ferrule adjacent thereto.

9. The connecting device according to claim 6 further comprising printed circuit board means mechanically and electrically connected to said seizure posts and said body.

10. The connecting device according to claim 9 further comprising connector means extending through said body and electrically coupled to said printed circuit board means.

* * * * *